(12) United States Patent
Covington et al.

(10) Patent No.: US 8,503,135 B2
(45) Date of Patent: Aug. 6, 2013

(54) MAGNETIC SENSOR WITH ENHANCED MAGNETORESISTANCE RATIO

(75) Inventors: Mark William Covington, Edina, MN (US); Qing He, Plymouth, MN (US); Wonjoon Jung, Eden Prairie, MN (US); Vladyslav Alexandrovich Vas'ko, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/238,981

(22) Filed: Sep. 21, 2011

(65) Prior Publication Data

US 2013/0071691 A1   Mar. 21, 2013

(51) Int. Cl.
*G11B 5/39* (2006.01)

(52) U.S. Cl.
USPC .......................................................... 360/313

(58) Field of Classification Search
USPC .......................................................... 360/313
See application file for complete search history.

(56) References Cited

U.S. PATENT DOCUMENTS

| | | | |
|---|---|---|---|
| 6,275,363 B1 * | 8/2001 | Gill | 360/324.2 |
| 6,507,457 B2 | 1/2003 | He et al. | |
| 6,674,617 B2 | 1/2004 | Gill | |
| 6,870,716 B2 | 3/2005 | Gill | |
| 7,180,716 B2 * | 2/2007 | Li et al. | 360/324.12 |
| 7,283,333 B2 * | 10/2007 | Gill | 360/324.1 |
| 7,333,306 B2 | 2/2008 | Zhao et al. | |
| 7,369,376 B2 * | 5/2008 | Guo et al. | 360/324.2 |
| 7,813,088 B2 | 10/2010 | Tsunekawa et al. | |
| 7,898,846 B2 | 3/2011 | Nagamine et al. | |
| 7,999,336 B2 * | 8/2011 | Wang et al. | 257/421 |
| 8,087,157 B2 * | 1/2012 | Kao et al. | 29/603.12 |
| 8,188,558 B2 * | 5/2012 | Wang et al. | 257/421 |
| 2003/0184919 A1 * | 10/2003 | Lin et al. | 360/314 |
| 2004/0257719 A1 | 12/2004 | Ohba et al. | |
| 2007/0015293 A1 | 1/2007 | Wang et al. | |
| 2008/0055793 A1 | 3/2008 | Djayaprawira et al. | |
| 2008/0124454 A1 | 5/2008 | Djayaprawira et al. | |
| 2009/0147392 A1 | 6/2009 | Prejbeanu et al. | |
| 2010/0080894 A1 | 4/2010 | Tsunekawa et al. | |

* cited by examiner

*Primary Examiner* — Mark Blouin
(74) *Attorney, Agent, or Firm* — Hall Estill Attorneys at Law

(57) ABSTRACT

Various embodiments of the present invention are generally directed to a magnetically responsive lamination that may be constructed with a spacer layer disposed between a first and second ferromagnetic free layer. At least one ferromagnetic free layer can have a coupling sub-layer that enhances magnetoresistance ratio (MR) of the magnetically responsive lamination.

20 Claims, 5 Drawing Sheets

MAGNETIC SENSOR WITH ENHANCED MAGNETORESISTANCE RATIO

SUMMARY

A magnetically responsive lamination may be constructed with a spacer layer disposed between a first and second ferromagnetic free layer. At least one ferromagnetic free layer can have a coupling layer that enhances magnetoresistance ratio (MR) of the magnetically responsive lamination.

DETAILED DESCRIPTION

The present disclosure generally relates to magnetoresistive data elements, particularly the enhancement of a magnetoresistive ratio (MR) with at least one coupling sub-layer. Data storage devices have become increasingly dependent on data readers with high data capacity and increased data transfer rates. Such demanding reader performance can strain reader amplitude and create unwanted noise during operation, which can adversely affect magnetoresistive ratios. Hence, enhancement of a reader's magnetoresistive ratio can enable increased data storage capacity and transfer rates in reduced form factor and increased areal resolution devices.

Enhancement of a data reader may be accomplished by disposing a non-magnetic spacer layer between ferromagnetic free layers, where at least one ferromagnetic free layer has a coupling sub-layer that enhances magnetoresistive ratio (MR) in the reader. The combination of dual ferromagnetic free layers and a coupling sub-layer can provide larger MR in excess of 100% that can be tuned and enhanced to accommodate a variety of performance characteristics, such as magnetic moment and magnetostriction. As such, a magnetic reader can be tuned during manufacture to conform to a multitude of performance enhancing parameters without sacrificing reader size and applicability.

Figure 1:
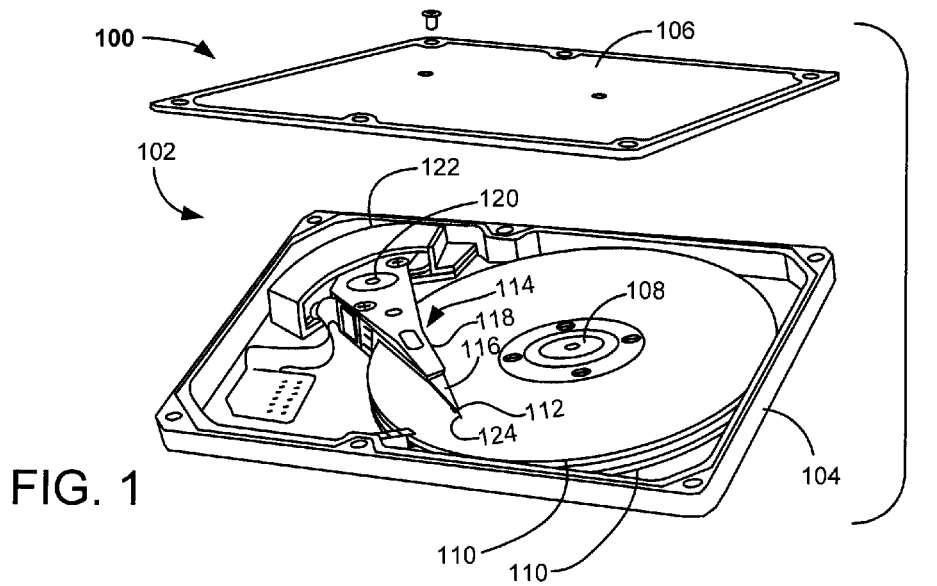
FIG. 1 is a perspective view of an example data storage device.

FIG. 1 provides an exemplary data storage device 100 that is capable of utilizing such a magnetic data reader in accordance with various embodiments. The device 100 is provided to show an exemplary environment in which various embodiments of the present invention can be advantageously practiced. It will be understood, however, that the claimed invention is not so limited.

The device 100 includes a substantially sealed housing 102 formed from a base deck 104 and top cover 106. An internally disposed spindle motor 108 is configured to rotate a number of storage media 110. The media 110 are accessed by a corresponding array of data transducers that are each supported by a head gimbal assembly (HGA) 112. Each HGA 112 can be supported by a head-stack assembly 114 ("actuator") that includes a flexible suspension 116, which in turn is supported by a rigid actuator arm 118. The actuator 114 preferably pivots about a cartridge bearing assembly 120 through application of current to a voice coil motor (VCM) 122.

In this way, controlled operation of the VCM 122 causes the transducers 124 of the HGA 112 to align with tracks (not shown) defined on the media surfaces to store data thereto or retrieve data therefrom. An ability to retrieve data from smaller data bits while maintaining proper alignment of the transducers 124 can be accomplished by decreasing the operational thickness of at least one transducing magnetic element. Thus, the device 100 can have increased capacity through the incorporation of transducing elements with reduced operational thickness and width which correspond to higher linear density resolution.

Figure 2:
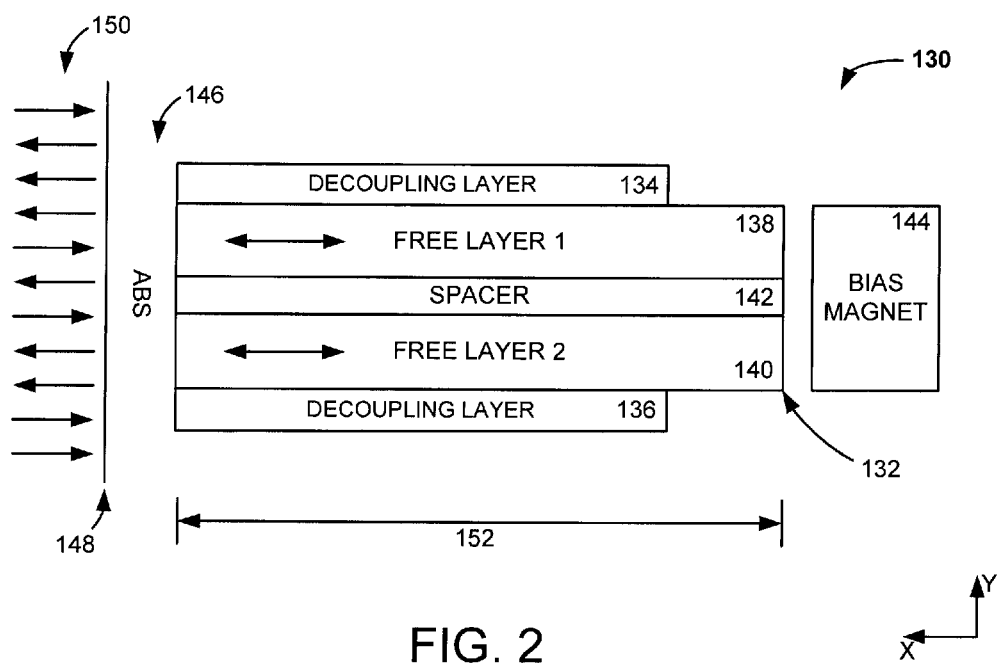
FIG. 2 generally illustrates an example magnetic element capable of being used in the data storage device of FIG. 1.

FIG. 2 displays a cross-section view of exemplary block representation of a magnetic element 130 capable of being used in the device 100 of FIG. 1. The magnetic element 130 has a magnetically responsive stack 132 disposed between first and second decoupling layers 134 and 136. The magnetically responsive stack 132 has first and second ferromagnetic free layers 138 and 140 separated by a non-magnetic spacer layer 142. Each ferromagnetic free layer 138 and 140 can be biased to a predetermined default magnetization by a bias magnet 144 positioned adjacent the stack 132 and distal to an air bearing surface (ABS) 146.

The ABS can separate the magnetically responsive stack 132 from a data storage media surface 148, which houses one or more data bits 150 arranged in predetermined positions and magnetic orientations. During operation, the magnetically responsive stack 132 can ride on the ABS and respond to the data bits 150 by providing a read signal. Performance of the stack 132 may be enhanced by maximizing the response to data bits 150 while minimizing signal noise. Such enhanced performance can be provided by extending the stripe height 152 of the stack 132 along the X axis, orthogonal to the ABS.

Performance of the element 130 may further be enhanced by providing magnetic shields adjacent the stack 132 to reduce magnetic response to inadvertent distal data bits 150 distal from the data bit directly across the ABS from the ferromagnetic free layers 138 and 140. While the shields aid in preventing magnetic fields from distal data bits from reaching the stack 132, the magnetization of the shields can adversely influence operation of the stack 132. Positioning the decoupling layers 134 and 136 between the ferromagnetic free layers 138 and 140 and shields can magnetically disconnect the ferromagnetic free layers 138 and 140 from any magnetic shields, thus allowing magnetic response to data bits 150 with greater accuracy, amplitude, and MR.

However, the various components of the element 130 are not required or limited to the configuration shown in FIG. 2, and can be modified, at will, to accommodate various operating environments and parameters. For example, one or more decoupling layers 134 and 136 can extend along the entire stripe height 152 of the stack 132 to provide increased magnetic decoupling between the stack 132 and any adjacent magnetically conductive components.

Figure 3:
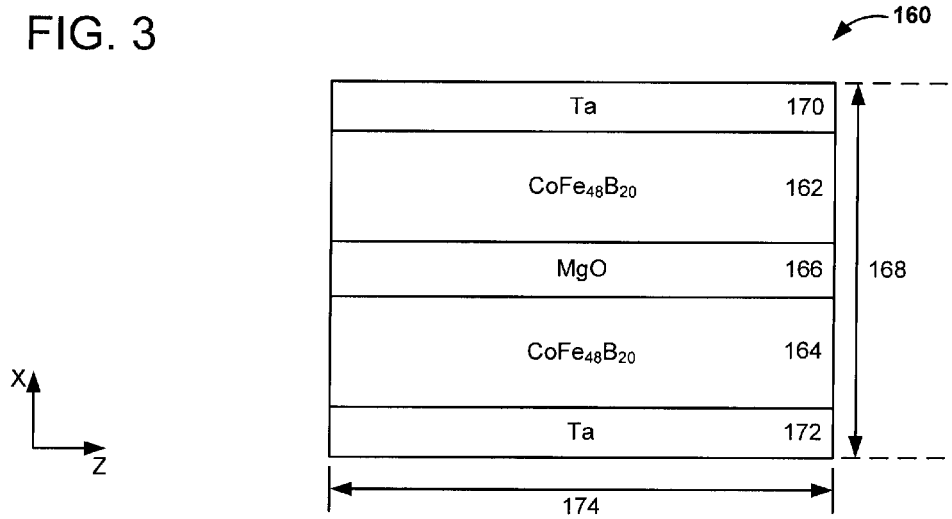
FIG. 3 displays a cross-section view of a portion of an example magnetic stack capable of being used in the magnetic element of FIG. 2.

FIG. 3 illustrates a block representation of an example data reader stack 160 as viewed from the ABS that can be characterized as a trilayer reader due to the two magnetic free layers 162 and 164 separated by the single tunneling layer 166. The lack of any pinned or hard magnetization layers or regions in the trilayer reader stack 160 can allow for enhanced data sensing with minimized shield-to-shield spacing 168.

As shown, the reader stack 160 can be constructed with specific materials that are not required or limited, but can provide predetermined data sensing performance. The ferromagnetic free layers 162 and 164 may be formed as a CoFeB alloy, such as $Co_{48}B_{20}$, while the tunneling layer 166 can be a non-magnetic material, such as MgO. Each ferromagnetic free layer 162 and 164 can be magnetically decoupled from any adjacent magnetically conductive shields with a decoupling layer 170 and 172 constructed of a magnetically non-conducting material like Tantalum.

The various layers of the reader stack 160 can be individually or collectively tuned to predetermined widths 174 parallel to the ABS (which may be parallel to the page) and thicknesses orthogonal to the ABS to provide particular MR in various data storage environments. For example, decoupling layers 170 and 172 can have matched thicknesses selected in response to the thickness of each ferromagnetic free layer 162 and 164 to provide a designed level of magnetic decoupling, such as within the range of 60-130 Oe, that corresponds to a predetermined MR range.

Figure 4:
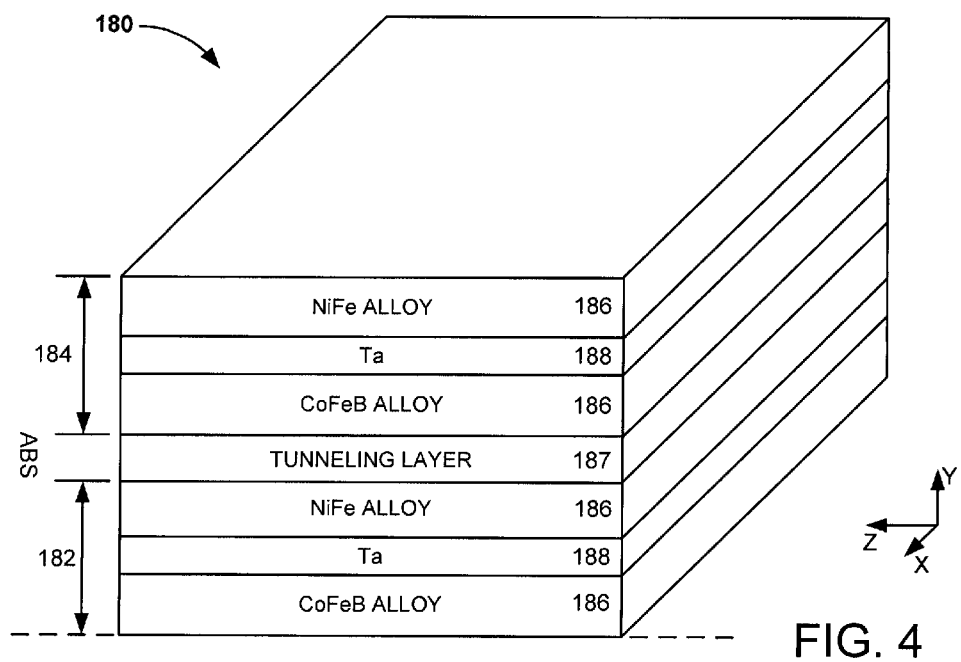
FIG. 4 shows an isometric view of an example magnetic stack as constructed and operated in accordance with various embodiments of the present invention.

While the reader stack 160 may accurately sense data bits, reducing the size of the reader stack 160, such as in reduced form factor data storage devices, can correspond to decreased magnetizations within the reader stack 160 that can minimize data sensing amplitude and MR. FIG. 4 generally provides an example magnetic stack 180 that generally illustrates how magnetostriction and MR can be tuned and enhanced with laminated ferromagnetic free layers 182 and 184. One or both ferromagnetic free layers 182 and 184 may have a combination of different magnetically conductive alloys, such as NiFe and CoFeB, constructed as coupling sub-layers 186. Each composite ferromagnetic free layer lamination can be tuned with varying thicknesses, widths, and material to enhance magnetostriction, magnetic moment, and MR across the tunneling layer 187.

In some ferromagnetic free layer configurations, a diffusion layer 188 may be disposed between the coupling sub-layers 186 of the magnetic free layers 182 and 184 to aid in isolating any crystallographic texture of the conductive alloys. Various embodiments may further tune and enhance various operational parameters, such as magnetic saturation, by modifying thickness and material composition of one or more diffusion layers 188 to provide predetermined operational interactions across the tunneling layer 187.

Figure 5:
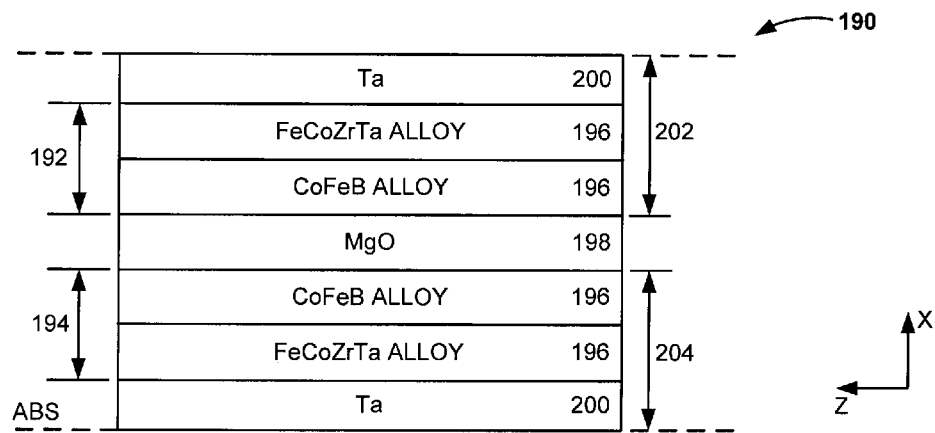
FIG. 5 shows an ABS view of a portion of an example magnetic stack constructed and operated in accordance with various embodiments of the present invention.

FIG. 5 shows another block representation of an example data reader stack 190 constructed with laminated magnetic free layers 192 and 194 each having directly contacting coupling sub-layers 196, but without the diffusion layers 188 displayed in FIG. 4. Each magnetic free layer 192 and 194 is formed as a directly contacting lamination of two or more magnetically conductive alloys. Such direct contact of the coupling sub-layers 196 may promote exchange coupling as contact between the layers can provide particular magnetostriction and MR across the tunneling layer 198 that can differ from magnetic free layer laminations that include a diffusion layer.

The ability to use a number of different alloys in the reader stack 190 can allow for diverse tuning to enhance performance. The use of FeCoZrTa alloy in a first coupling sub-layer 196 may provide enhanced coupling with respect to the contacting CoFeB alloy second coupling sub-layer 196 and enhanced decoupling with respect to a decoupling layer 200. The MR of the reader stack 190 can be further tuned by selecting the thickness 202 of the combined first magnetic free and top decoupling layers 192 and 200 in response to the combined thickness 204 of the second magnetic free and bottom decoupling layers 194 and 200. That is, the thickness 202 can be modified to a differing size from the thickness 204 to enhance and provide a predetermined MR across the tunneling layer 198.

Figure 6:
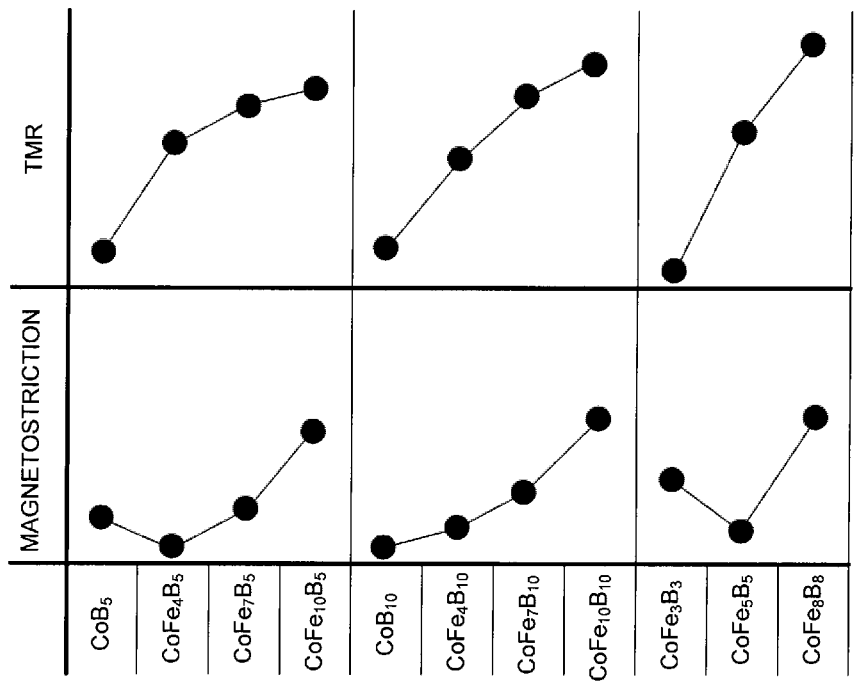
FIG. 6 provides example operational data for various materials capable of being used in various embodiments of the present invention.

FIG. 6 illustrates various operating characteristics associated with different magnetically conductive materials, which can be selectively formed into the reader stacks 160, 180, and 190 of FIGS. 3-5. As displayed, the magnetostriction and tunneling magnetoresistive ratio (TMR) values for the various alloys illustrate the operational variance associated with magnetic alloy composition. Such variance further illustrates the ability to tune and enhance a data reader stack by constructing ferromagnetic free layers with similar or dissimilar alloy compositions that operate to provide a predetermined amount of magnetostriction, magnetic flux, and TMR.

As an example, a first magnetic free layer, i.e. $CoFe_{10}B_5$, with a relatively high TMR and magnetostriction can be formed and a second magnetic free layer material is selected in response, i.e. $CoFe_5B_5$, to complement the previously deposited alloy and exhibits enhanced performance with high TMR and magnetic flux with minimal magnetostriction. Similarly, various combinations of similar or dissimilar alloys can be constructed in relation to one another to provide enhanced operation with predetermined TMR and magnetostriction.

Figure 7:
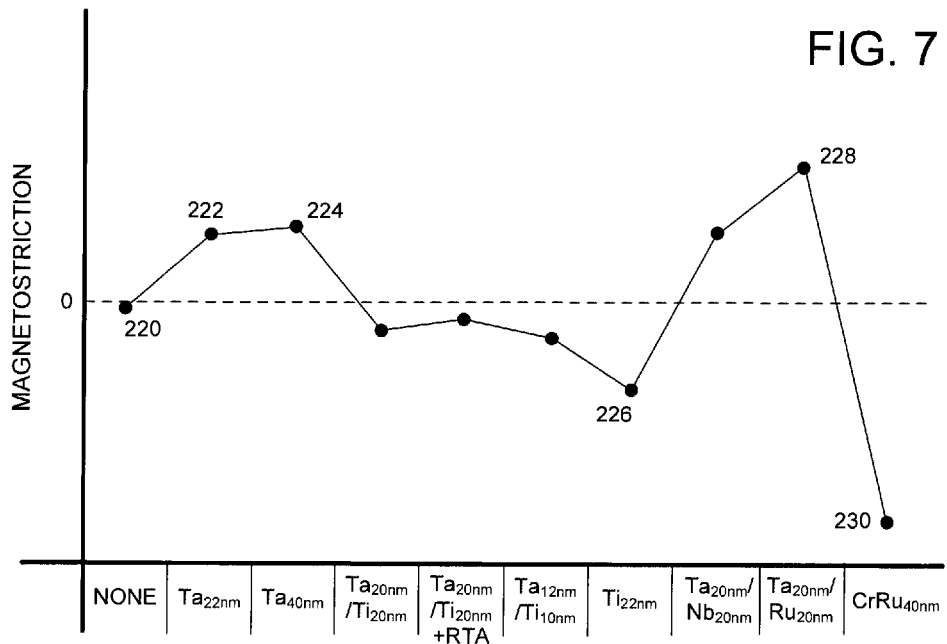
FIG. 7 graphs operational data of various material compositions and thicknesses capable of being used in various embodiments of the present invention.

In some embodiments, the operational data shown in FIG. 6 is used in combination with various other performance data to enhance and tune the structure and operation of a data reader stack. FIG. 7 displays example magnetostriction performance data with varying decoupling layer compositions and thicknesses. When one or more decoupling layers are selected and manipulated, various magnetostriction, magnetic flux, and MR can be tuned and enhanced with the magnetic free layers to provide enhanced reader stack performance.

Turning to the data shown in FIG. 7, when no decoupling layer is used, a nominal magnetostriction is observed at point 220. As thicker layers of Tantalum are used, magnetostriction increases at points 222 and 224. Constructing a decoupling layer as a lamination of a combination of materials and thicknesses leads to negative magnetostriction, as illustrated by the combination of 12 nm of Tantalum and 10 nm of Titanium at point 226. However, certain combinations can lead to measurable amounts of magnetostriction, such as a lamination of 20 nm of both Tantalum and Ruthenium at point 228.

While a variety of design considerations may be undertaken to utilize any decoupling layer composition shown in FIG. 7, various embodiments can have one or both decoupling layers formed of 40 nm of CrRu, which induces negative magnetostriction at point 230 that can be used in combination with at least one positive magnetostriction magnetic free layer to provide near-zero net magnetostriction and more stable data reader stack performance.

Figure 8:
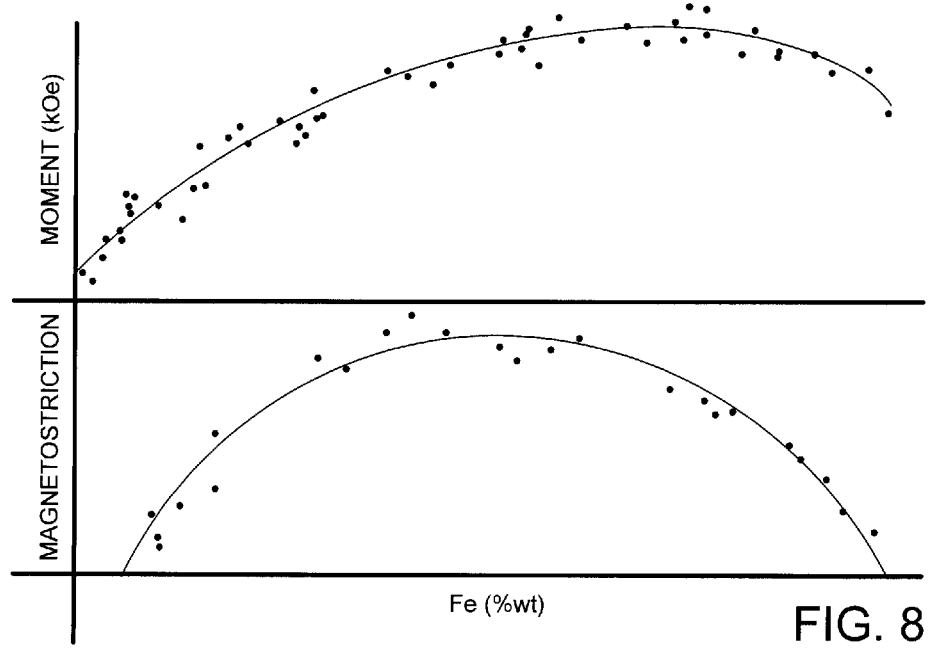
FIG. 8 provides example operational characteristics of a magnetic element constructed and operated in accordance with various embodiments of the present invention.

FIG. 8 provides example operational data corresponding to the weight percentage of Fe used in one or more magnetic free layers. As shown, a variety of magnetic moment and magnetostriction values correspond with varying the percentage of Fe. Such variety of operational behavior allows for the percentage of Fe to be designed and selected to provide a predetermined magnetostriction and magnetic moment for a data reader element.

Figure 9:
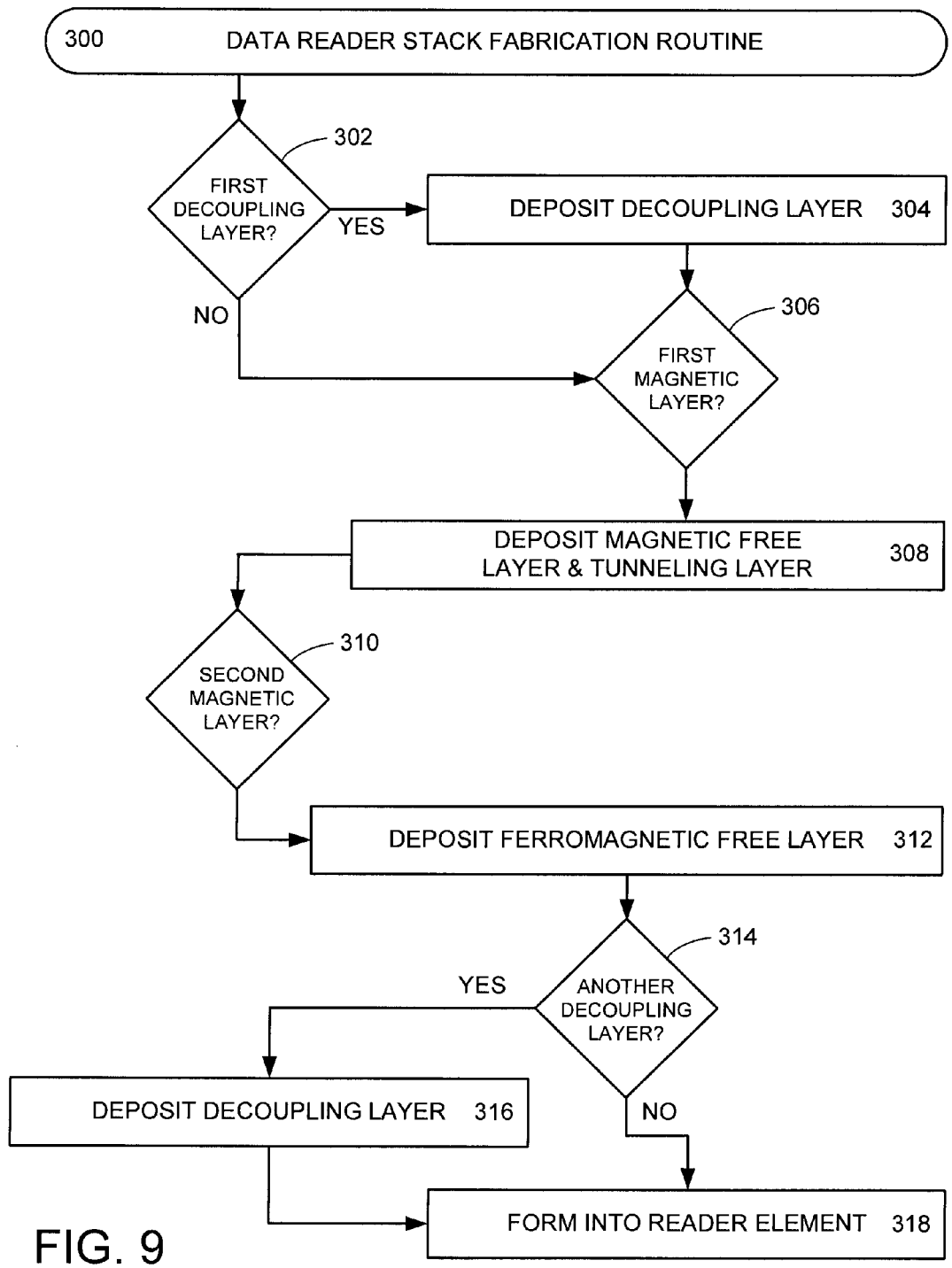
FIG. 9 provides a flow chart of an example data reader stack fabrication routine performed in accordance with various embodiments of the present invention.

With the magnitude of operational data corresponding to various data reader stack configurations, numerous combinations of materials, thicknesses, and layers can be enhanced for environment and performance to provide accurate data sensing due to high MR. Various embodiments tune the construction of a data reader stack layer by layer to enhance performance and secure predetermined MR and magnetostriction during operation. An example reader stack fabrication routine 300 is generally illustrated in FIG. 9.

Initially, the routine 300 evaluates if a decoupling layer is to be a part of the data reader stack in decision 302, and if so, the material composition and thickness of the decoupling layer. The operational data from FIGS. 6-7 may provide guidance and examples that could be implemented in the decoupling layer individually, or in combination with other materials. A decision to use a decoupling layer proceeds to step 304 where the designed decoupling layer is formed.

Either after the decoupling layer is deposited in step 304 or if no decoupling layer is chosen in decision 302, decision 306 then evaluates first magnetic layer configurations including at least material composition, number of layers, and thickness. While no limitations exist for the configuration of the magnetic free layer, the reader stacks of FIGS. 3-5 provide several options while the data of FIGS. 6 and 8 illustrate operational data that can be used to enhance the magnetic free layer design for at least MR and magnetostriction. Design of the magnetic free layer in decision 306 advances routine 300 to step 308 where the magnetic free layer is deposited followed by a tunneling layer, such as layer 187 of FIG. 4.

Subsequently, decision 310 determines the configuration of the second magnetic free layer, which can be similar or dissimilar to the free layer deposited in step 308. That is, the configuration of the second magnetic free layer is not limited and can match or be uniquely designed with respect to the first magnetic free layer. As an example, the first magnetic free layer may be a lamination of conductive alloy sub-layers, such as sub-layers 192 and 194 of FIG. 5, that enhance MR through exchange coupling while the second magnetic free layer may be a lamination of conductive sub-layers separated by a diffusion layer, such as the free layer 184 of FIG. 4, that enhances MR with high magnetic stability.

Complete design of the second magnetic free layer in decision 310 is followed by step 312 where the second free layer is deposited. Deposition of the second magnetic free layer in step 312 completes the trilayer magnetic reader stack that can sense data bits accurately and quickly due to enhanced magnetostriction, magnetic moment, and magnetic flux. Such trilayer stack can be used in a variety of data storage element and is not limited to a rotating data storage device. Decision 314 evaluates the design of the stack with respect to another decoupling layer, which may enhance stack performance in the event magnetically conductive shields are positioned adjacent the trilayer reader stack.

If another decoupling layer is chosen, decision 314 further evaluates the various material and thickness configurations conducted in decision 302 and proceeds to enhance the performance of the reader stack by configuring the next decoupling layer in response to the previously deposited layers, which may or may not result in a second decoupling layer that matches the first decoupling layer configuration. Next, step 316 forms the additional decoupling layer atop the second magnetic free layer.

Regardless of the presence of a second decoupling layer, the existing reader stack, which may include the trilayer portion and one or more decoupling layers, is implemented into a reader element in step 318. Such implementation can include the formation of reader shields and attachment, both electronically and physically, to a slider, such as slider 112 of FIG. 1. With the tuning of the decoupling and magnetic free layers, the reader stack can be enhanced during construction to accommodate a variety of different operational environments with predetermined magnetic response (MR) and enhanced magnetic stability. In some embodiments, the reader stack construction of routine 300 can be expanded with the fabrication of seed and cap layers, such as layers 170 and 172 of FIG. 3, respectively before and after the decoupling layer formation of steps 304 and 316.

It should be noted that the various layers and sub-layers of the data reader stack can be deposited in a variety of non-limiting manners, such as chemical vapor, physical vapor, sputtering, and atomic layer deposition. The various decisions and deposition of layers in routine 300 allow for a wide variety of magnetic stack configurations that can provide tuned operational attributes to suit different needs. Such variability illustrates that the reader stack fabrication is not limited and merely exemplary as the decisions and steps can be modified, moved, or removed, as desired.

It can be appreciated that the configuration and material characteristics of the magnetic reader element described in the present disclosure allows for enhanced operation through enhanced structure that increases magnetoresistive ratio and magnetic flux while decreasing magnetostriction. The ability to tune the various magnetic free layers with sub-layers allow for construction of a reader element that exhibits enhanced predetermined operation behavior even in high linear and areal bit density data storage applications It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetic sensor comprising:
a magnetically responsive lamination of a non-magnetic spacer layer disposed between first and second ferromagnetic free layers, at least one ferromagnetic free layer having a coupling sub-layer that enhances magnetoresistance ratio (MR), the coupling sub-layer comprising a different material than the at least one ferromagnetic free layer.

2. The magnetic sensor of claim 1, wherein the first and second ferromagnetic free layers each have a coupling sub-layer.

3. The magnetic sensor of claim 1, wherein the magnetically responsive lamination is disposed between decoupling layers.

4. The magnetic sensor of claim 3, wherein each decoupling layers is Tantalum.

5. The magnetic sensor of claim 1, wherein the coupling layer is FeCoZrTa.

6. The magnetic sensor of claim 1, wherein the coupling layer is $CoFe_{48}B_{20}$.

7. The magnetic sensor of claim 1, wherein the coupling layer is NiFe.

8. The magnetic sensor of claim 1, wherein the first and second ferromagnetic free layers are each CoFeB alloys.

9. The magnetic sensor of claim 1, wherein a diffusion layer is disposed between each coupling sub-layer and ferromagnetic free layer.

10. The magnetic sensor of claim 9, wherein the diffusion layer is Tantalum.

11. The magnetic sensor of claim 1, wherein the coupling sub-layer has different magnetostriction than the first and second ferromagnetic free layers.

12. The magnetic sensor of claim 1, wherein the at least one ferromagnetic free layer is a coupling sub-layer has a substantially zero net magnetostriction.

13. A magnetic stack comprising:
a reader lamination disposed between first and second decoupling layers, the reader lamination comprising a non-magnetic spacer layer disposed between first and second ferromagnetic free layers, each ferromagnetic free layer having a coupling sub-layer separated from the respective ferromagnetic free layers by a diffusion layer, each coupling sub-layer comprising a different material than the respective ferromagnetic free layers.

14. The magnetic stack of claim 13, wherein each decoupling layer and diffusion layer is Tantalum.

15. The magnetic stack of claim 13, wherein the spacer layer is MgO.

16. The magnetic stack of claim 13, wherein the first decoupling layer, first ferromagnetic free layer, and respective diffusion layer has a first thickness that substantially differs from a second thickness defined by the second decoupling layer, second ferromagnetic free layer, and respective diffusion layer.

17. The magnetic stack of claim 13, wherein at least one coupling layer is NiFe and at least one ferromagnetic free layer is a CoFeB alloy.

18. A method comprising:
constructing a magnetically responsive lamination by forming a non-magnetic spacer layer between first and second ferromagnetic free layers; and
enhancing a magnetoresistance ratio (MR) of the magnetically responsive lamination by positioning a coupling sub-layer adjacent at least one ferromagnetic free layer, the coupling sub-layer comprising a different material than the at least one ferromagnetic free layer.

19. The method of claim 18, wherein the at least one coupling sub-layer produces a substantially zero net magnetostriction with each respective ferromagnetic free layer.

20. The method of claim 18, wherein the MR ratio is enhanced in relation to a predetermined shield-to-shield spacing of the magnetically responsive lamination.

* * * * *